(12) United States Patent
Kim

(10) Patent No.: US 8,835,314 B2
(45) Date of Patent: Sep. 16, 2014

(54) METHOD FOR FABRICATING SEMICONDUCTOR MEMORY DEVICE

(75) Inventor: Won-Kyu Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 113 days.

(21) Appl. No.: 13/478,625

(22) Filed: May 23, 2012

(65) Prior Publication Data

US 2013/0157461 A1 Jun. 20, 2013

(30) Foreign Application Priority Data

Dec. 19, 2011 (KR) .......................... 10-2011-0137632

(51) Int. Cl.
*H01L 21/44* (2006.01)

(52) U.S. Cl.
USPC ............................. 438/671; 438/669; 438/675

(58) Field of Classification Search
USPC .......................................... 438/671, 669, 672
See application file for complete search history.

(56) References Cited

U.S. PATENT DOCUMENTS

2012/0329268 A1* 12/2012 Soda et al. .................... 438/631

FOREIGN PATENT DOCUMENTS

KR 1020100042941 4/2010
KR 1020120082542 7/2012

* cited by examiner

*Primary Examiner* — Jae Lee
(74) *Attorney, Agent, or Firm* — IP & T Group LLP

(57) ABSTRACT

A method for fabricating a semiconductor device includes forming an etch-target layer over a substrate having a first region and a second region, stacking first and second hard mask layers over the etch-target layer, forming spacer patterns over the second hard mask layer of the first area, etching the second hard mask layer using the spacer patterns as an etch barrier, forming a hard mask pattern over the first hard mask layer of the second region, etching the first hard mask layer using the second hard mask layer of the first region and the hard mask pattern of the second region as etch barriers, removing the hard mask pattern of the second region, and etching the etch-target layer using the first and second hard mask layers of the first region and the first hard mask layer of the second region as etch barriers.

14 Claims, 8 Drawing Sheets

METHOD FOR FABRICATING SEMICONDUCTOR MEMORY DEVICE

CROSS-REFERENCE TO RELATED APPLICATIONS

The present application claims priority of Korean Patent Application No. 10-2011-0137632, filed on Dec. 19, 2011, which is incorporated herein by reference in its entirety.

BACKGROUND

1. Field

Exemplary embodiments of the present invention relate to semiconductor fabrication technology, and more particularly, to a method for fabricating micro patterns of a semiconductor memory device.

2. Description of the Related Art

With the high integration of semiconductor memory devices, it has become difficult to pattern a cell region thereof using a mask process. Thus, a DPT (Double Patterning Technology) process has been applied. Since the DPT process uses a plurality of hard mask layers, the total thickness of the hard mask structure increases. In a peripheral region, however, the thickness of the hard mask structure is to be reduced, in order to form a shallow junction therein.

When the cell region and the peripheral region are separately patterned for such a reason as mentioned above, the numbers of masks and process steps increase. Furthermore, one region patterned first may be damaged by a following process for patterning the other region.

SUMMARY

Exemplary embodiments of the present invention are directed to a method for fabricating a semiconductor memory device, which is capable of performing a patterning process in a cell region and a peripheral region at the same time by forming stepped portions of a hard mask structure therebetween.

In accordance with an exemplary embodiment of the present invention, a method for fabricating a semiconductor device includes forming an etch-target layer over a substrate having a first region and a second region, stacking a first hard mask layer and a second hard mask layer over the etch-target layer, the second hard mask layer having an etching selectivity with the first hard mask layer, forming spacer patterns over the second hard mask layer of the first area, etching the second hard mask layer using the spacer patterns as an etch barrier, forming a hard mask pattern over the first hard mask layer of the second region, etching the first hard mask layer using the second hard mask layer of the first region and the hard mask pattern of the second region as etch barriers, removing the hard mask pattern of the second region, and etching the etch-target layer using the first and second hard mask layers of the first region and the first hard mask layer of the second region as etch barriers.

In accordance with another exemplary embodiment of the present invention, a method for fabricating a semiconductor device includes forming an etch-target layer over a substrate having a first region and a second region, forming a first hard mask pattern and a second hard mask pattern in the first region and the second region, respectively, wherein the first and second hard mask patterns have different heights, performing an etching process using the first and second hard mask patterns as an etch barrier to form a first pattern and a second pattern in the first region and the second region, respectively.

DETAILED DESCRIPTION

Figure 1A:
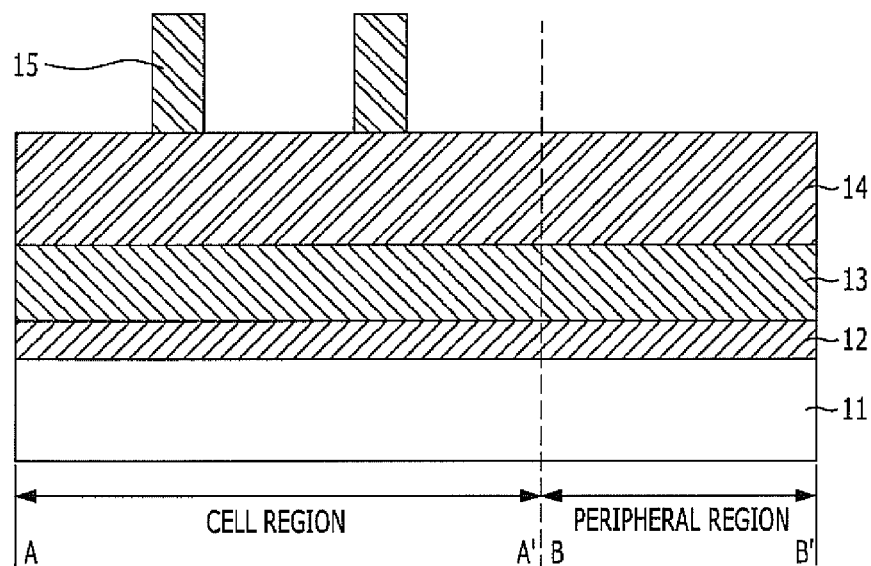
FIGS. 1A to 1H are cross-sectional views illustrating a method for fabricating a semiconductor device in accordance with an exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 1A to 1H are cross-sectional views illustrating a method for fabricating a semiconductor device in accordance with an exemplary embodiment of the present invention. FIGS. 2A to 2H are plan views of FIGS. 1A to 1H, respectively. In this embodiment of the present invention, a bit line formation process of a cell region A-A' and a gate formation process of a peripheral region B-B' are described as an example.

Figure 2A:
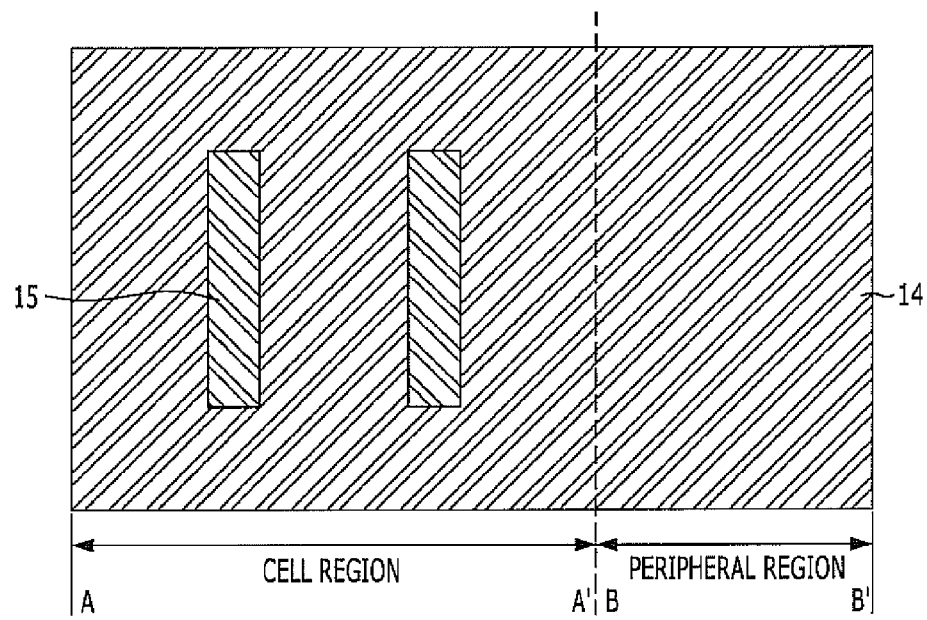
FIGS. 2A to 2H are plan views of FIGS. 1A to 1H, respectively.

Referring to FIGS. 1A and 2A, a hard mask layer is formed over a substrate 11 having a cell region and a peripheral region. The peripheral region includes a core region in which sub word lines, sense amplifiers or the like are arranged adjacent to the cell region. The substrate 11 may include a semiconductor substrate subjected to a certain process.

A conductive layer 12 is formed over the substrate 11. The conductive layer 12 which is to be used as a bit line electrode may include tungsten. The conductive layer 12 may include a stacked structure of a barrier metal layer and a metal layer.

A first hard mask layer 13 and a second hard mask layer 14 are stacked over the conductive layer 12. The first hard mask layer 13 includes nitride and the second hard mask layer 14 includes polysilicon.

A sacrificial pattern 15 is formed over the second hard mask layer 14 of the cell area. The sacrificial pattern 15 is used to form space patterns during a subsequent process and may be formed of a material which may be easily removed. For example, the sacrificial pattern 15 includes amorphous carbon or spin-on carbon (SOC). The sacrificial pattern 15 is formed by the following process: a sacrificial layer is formed over the second hard mask layer 14, an anti-reflection layer and a photoresist pattern are formed over the sacrificial layer, and the anti-reflection layer and the sacrificial layer are etched using the photoresist pattern as an etch barrier.

Figure 1B:
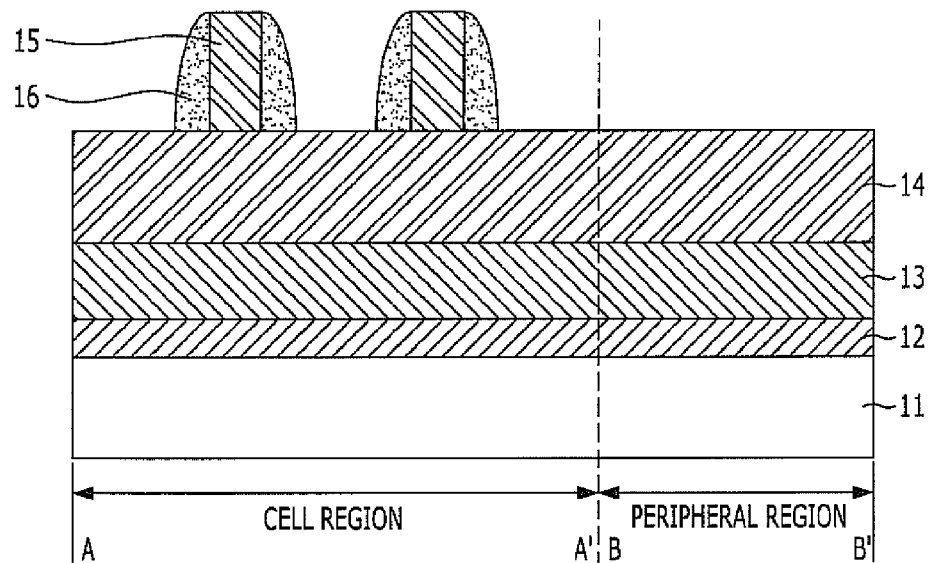
Figure 2B:
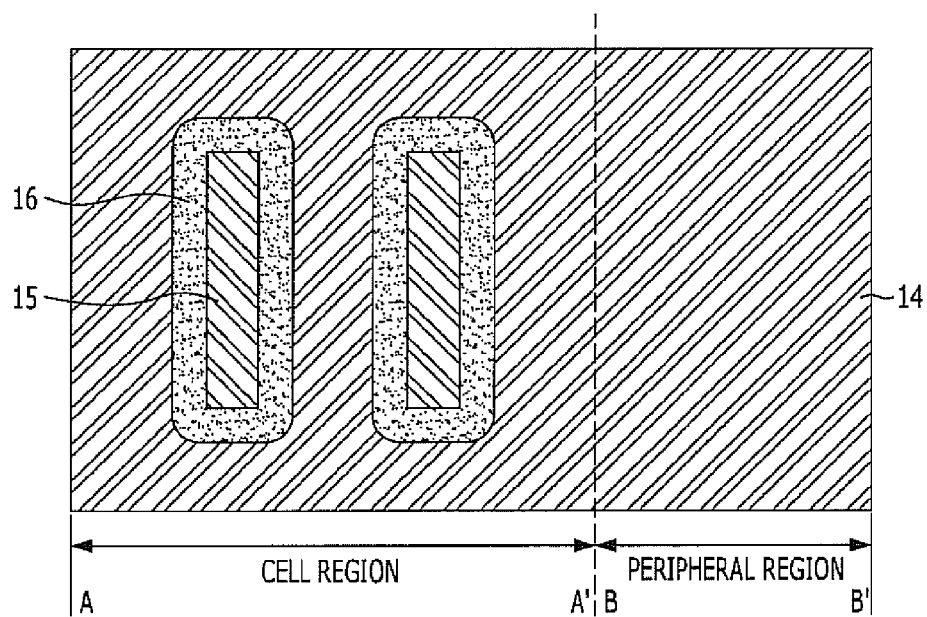

Referring to FIGS. 1B and 2B, spacer patterns 16 are formed on the sidewalls of the sacrificial pattern 15.

In order to form the spacer patterns 16, a spacer insulation layer is formed along the stepped profile of the entire structure including the sacrificial pattern 15. The spacer insulation layer is used to form the spacer patterns and may be formed of a material having an etching selectivity with the lower second hard mask layer 14. For example, the spacer insulation layer includes oxide. The spacer insulation layer may be formed to have a high step coverage, in order to form patterns having a uniform critical dimension (CD).

The spacer insulation layer is etched to leave the spacer patterns 16 on the sidewalls of the sacrificial pattern 15. The etching of the spacer insulation layer may be performed by an etch-back process and is performed until the top of the sacrificial pattern 15 and the surface of the second hard mask layer 14 are exposed.

Referring to FIG. 2B, the spacer patterns 16 may be formed in a cylindrical shape to surround the sidewalls of the sacrificial layer 15.

Figure 1C:
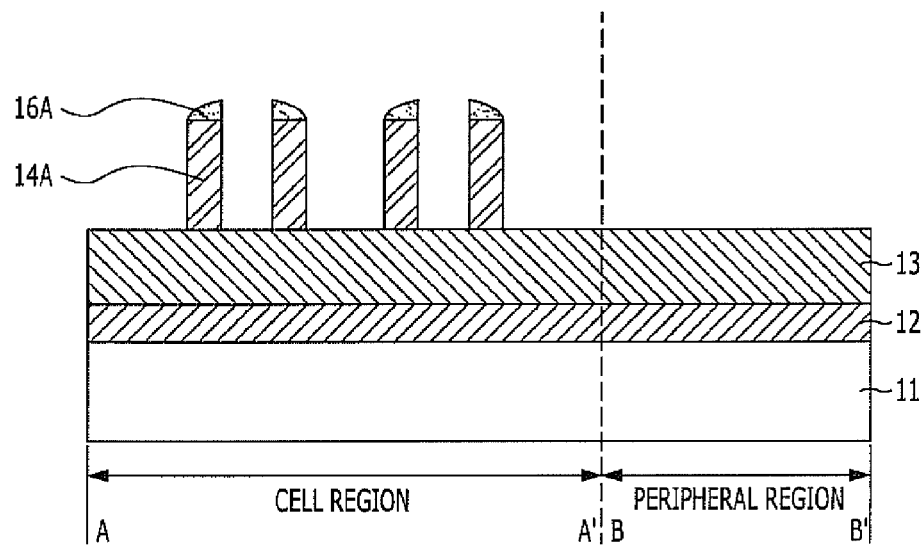
Figure 2C:
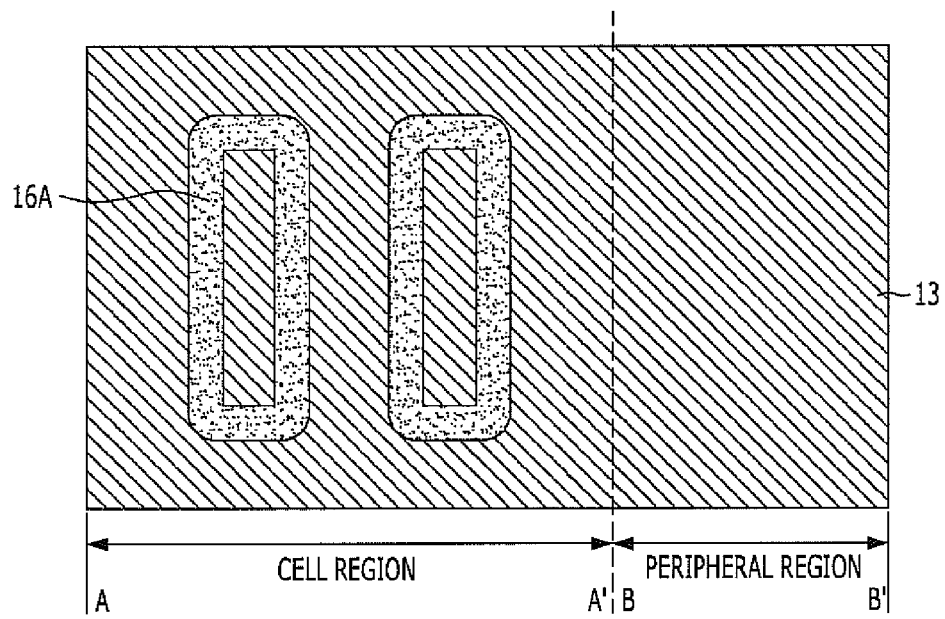

Referring to FIGS. 1C and 2C, the sacrificial pattern 15 is removed. The sacrificial pattern 15 may be removed by dry etching. The dry etching includes, for example, an oxygen plasma etching.

The second hard mask layer 14 is etched using the spacer patterns 16 as an etch barrier.

Therefore, second hard mask patterns 14A and spacer patterns 16A are formed over the first hard mask layer 13 of the cell area.

Figure 1D:
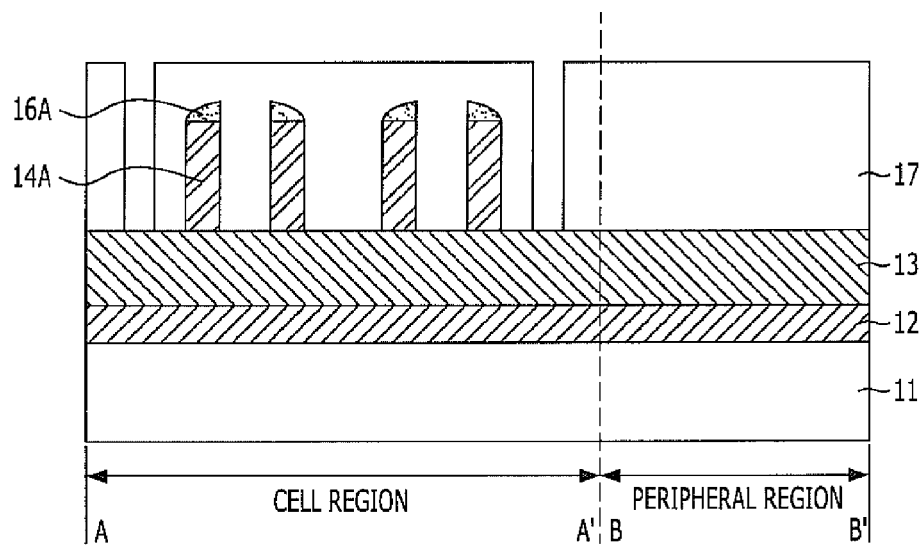
Figure 2D:
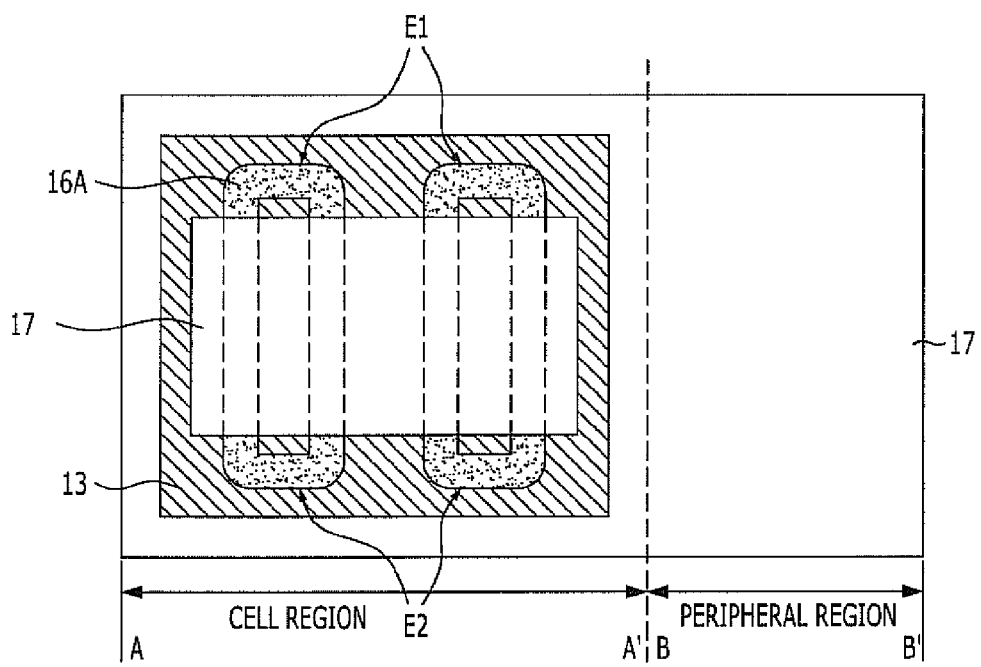

Referring to FIGS. 1D and 2D, a cut mask 17 is formed with such a thickness as to adequately fill the space between the second hard mask patterns 14A over the first hard mask layer 13. As shown in FIG. 2D, the cut mask 17 serves to remove the both ends E1 and E2 of the spacer patterns 16A and the second hard mask patterns 14A and form those patterns as a line type, which are formed as a cylinder type during the Spacer Patterning Technology (SPT) process. The cut mask 17 is patterned in such a shape as to expose the both ends E1 and E2 of the spacer patterns 16A while covering both the peripheral region and the cell region.

Figure 1E:
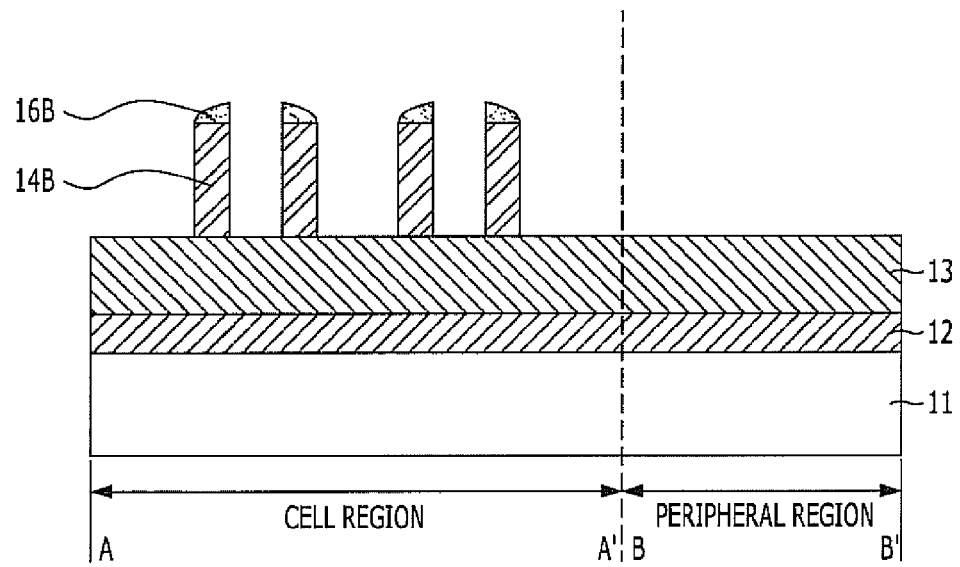
Figure 2E:
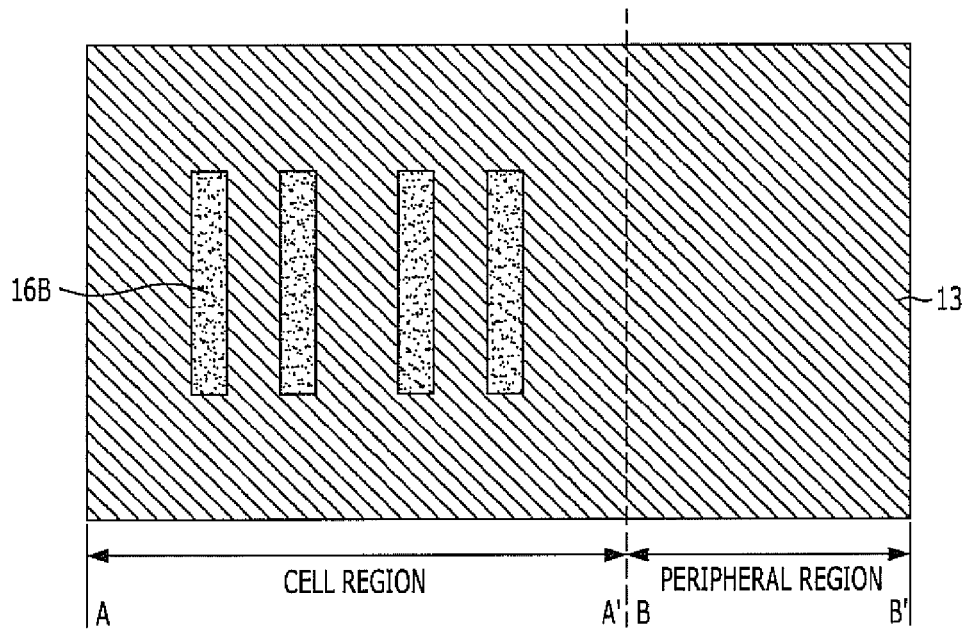

Referring to FIGS. 1E and 2E, the both ends of the spacer patterns 16A and the second hard mask patterns 14A are etched using the cut mask 17 as an etch barrier, thereby forming spacer patterns 16B and second hard mask patterns 14B having a line shape.

Figure 1F:
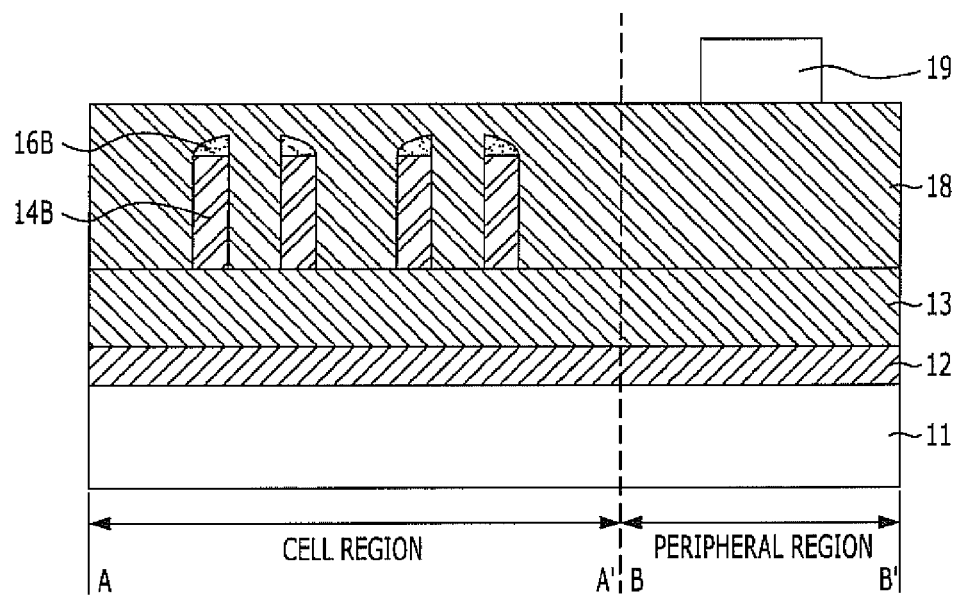
Figure 2F:
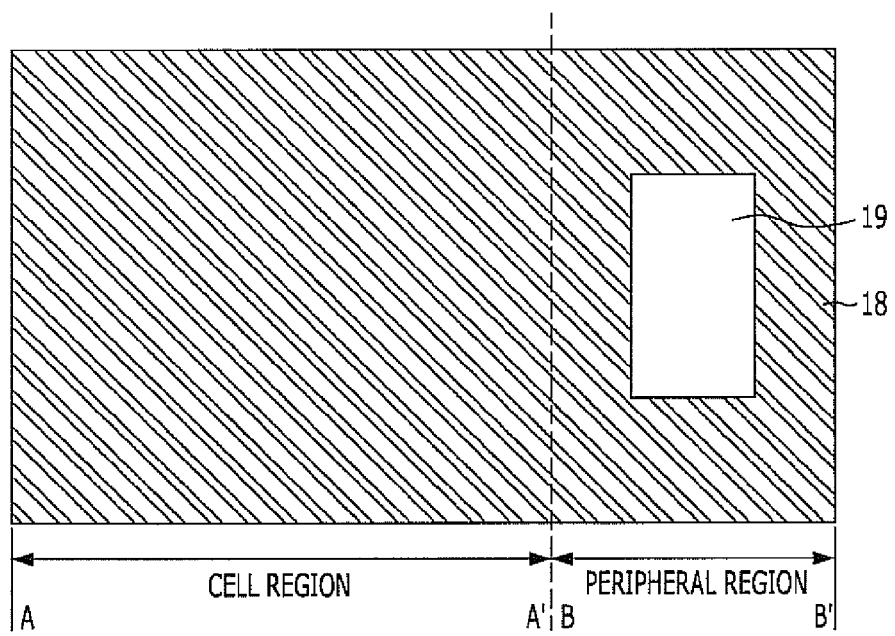

Referring to FIGS. 1F and 2F, a hard mask carbon layer 18 is formed with such a thickness as to adequately fill the space between the second hard mask patterns 14B over the entire structure including the first hard mask layer 13. The hard mask carbon layer 18 serves as a hard mask for forming a pattern of the peripheral region and is formed of a material which may be easily removed during a subsequent process. The hard mask carbon layer 18 may include, for example, amorphous carbon or SOC.

A photoresist pattern 19 is formed over the hard mask carbon layer 18 of the peripheral region. The photoresist pattern 19 is used to define a pattern of the peripheral region and is formed by applying a photoresist layer on the hard mask carbon layer 18 and then patterning the photoresist layer through exposure and development. In particular, the pattern of the peripheral region is formed to have a larger CD than the patterns of the cell area.

Figure 1G:
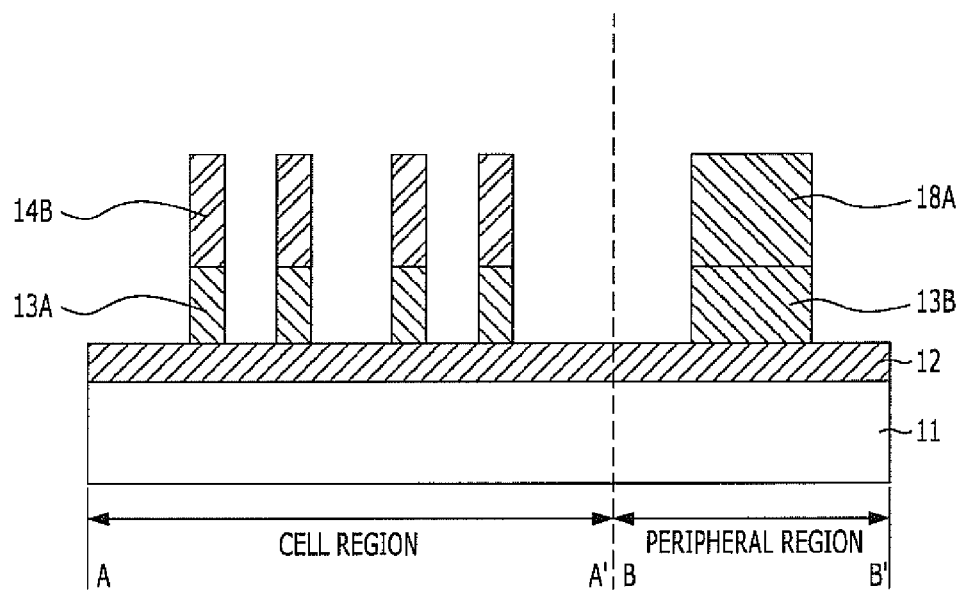
Figure 2G:
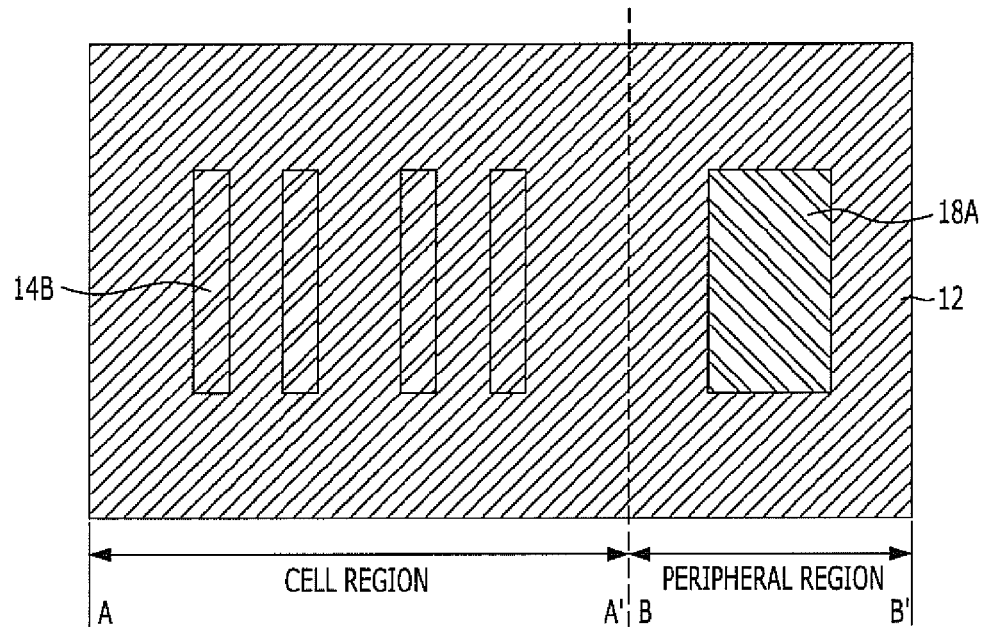

Referring to FIGS. 1G and 2G, the hard mask carbon layer 18 is etched using the photoresist pattern 19 as an etch barrier, thereby forming a hard mask carbon pattern 18A.

Using the second hard mask patterns 14B of the cell region and the hard mask carbon pattern 18A of the peripheral region as etch barriers, the first hard mask layer 13 is etched to form first hard mask patterns 13A and 13B having different CDs in the cell region and the peripheral region, respectively.

During the process of forming the first hard mask patterns 13A and 13B, the spacer patterns 16B and the photoresist pattern 19 may be removed, or the process of forming the first hard mask patterns 13A and 13B may be performed after the spacer patterns 16B and the photoresist pattern 19 are removed.

Accordingly, the first hard mask patterns 13A and 13B having different CDs are formed in the cell region and the peripheral region, respectively, over the conductive layer 12.

Figure 1H:
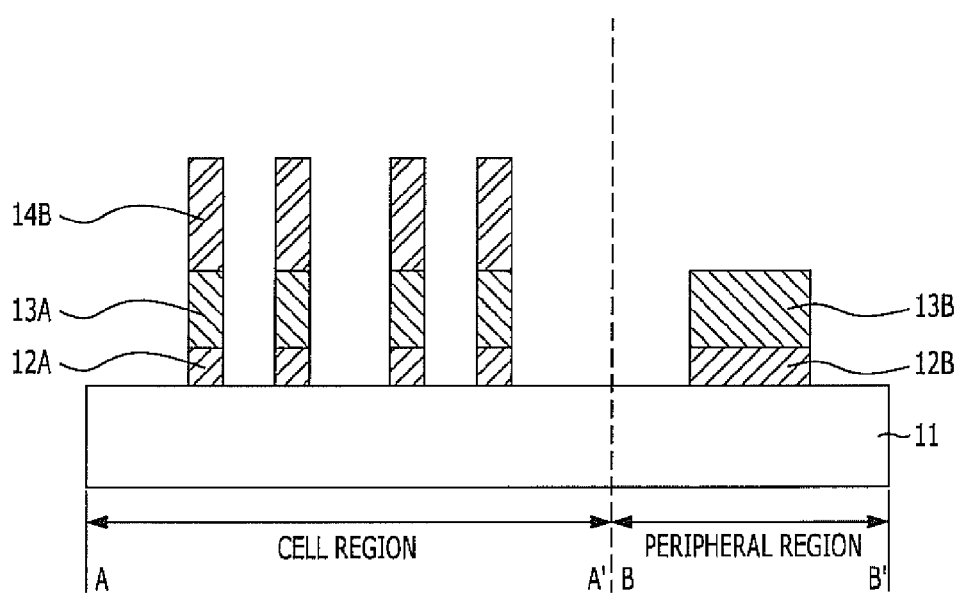
Figure 2H:
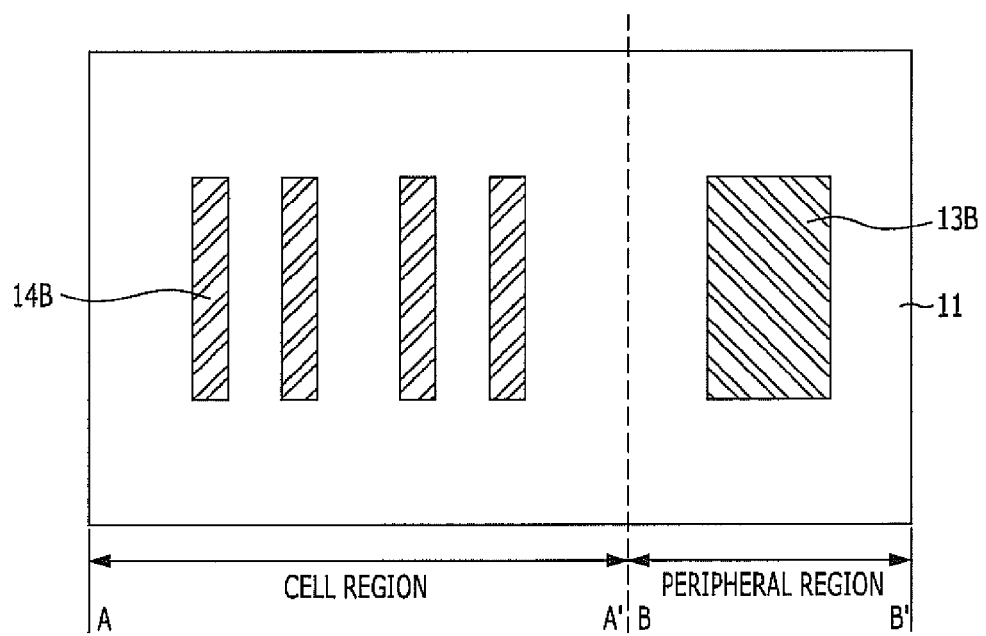

Referring to FIGS. 1H and 2H, the hard mask carbon pattern 18A is removed. The hard mask carbon pattern 18A is removed by dry etching, and the dry etching includes, for example, an oxygen strip process.

When the hard mask carbon pattern 18A is removed, the first hard mask patterns 13A and the second hard mask patterns 14B are left as an etch barrier over the conductive layer 12, in the cell area. In the peripheral region, however, the first hard mask pattern 13B is left. The Using the first hard mask patterns 13A and the second hard mask patterns 14B in the cell region and the first hard mask pattern 13B of the peripheral region as etch barriers, the conductive layer 12 is etched to form patterns 12A and 12B. The patterns 12A and 12B formed in the cell region and the peripheral region, respectively, have different CDs. When the patterns 12A and 12B are formed of a conductive layer, the patterns 12A and 12B may be used as electrodes.

In this embodiment of the present invention, the etch barriers having different heights are formed in the cell region and the peripheral area over the conductive layer 12. That is, the etch barrier of the cell region is formed to have a relatively large height, and the etch barrier of the peripheral region is formed to have a relatively small height. Accordingly, the etching process of the present invention may satisfy the micro pattern formation condition of the cell area and the shallow junction formation condition of the peripheral region.

Furthermore, since the etch barriers of the cell region and the peripheral region may be formed to different heights, the patterns of the cell region and the peripheral region may be formed through one etching process. Therefore, the number of process steps and the cost thereof may be reduced in an effective manner, and the process margin may be secured.

Meanwhile, the above hard mask layers are describe as an example in accordance with the exemplary embodiment of the present invention. That is, any layers used as hard mask layers capable of securing an etching selectivity may be applied. The conductive layer uses as electrodes or any hard mask layer for etching its bottom layer may be used as the finally-etched layer of the present invention. Furthermore, the embodiment of the present invention may be applied to the process using the stepped portions of the hard mask between the cell region and the peripheral region and the pattern formation process using the SPT process.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:

forming an etch-target layer over a substrate having a first region and a second region;

stacking a first hard mask layer and a second hard mask layer over the etch-target layer, the second hard mask layer having an etching selectivity with the first hard mask layer;

forming spacer patterns over the second hard mask layer of the first region;

etching the second hard mask layer using the spacer patterns as an etch barrier;

forming a hard mask pattern over the first hard mask layer of the second region;

etching the first hard mask layer using the second hard mask layer of the first region and the hard mask pattern of the second region as etch barriers;

removing the hard mask pattern of the second region; and etching the etch-target layer using the first and second hard mask layers of the first region and the first hard mask layer of the second region as etch barriers, wherein the first region comprises a cell region and the second region comprises a peripheral region.

2. The method of claim 1, wherein the forming of the spacer patterns comprises:

forming a sacrificial pattern over the second hard mask layer of the first region;

forming an oxide layer along the entire surface of a structure including the sacrificial pattern;

forming the spacer patterns on the sidewalls of the sacrificial pattern by etching the oxide layer; and removing the sacrificial pattern.

3. The method of claim 1, wherein the forming of the hard mask pattern comprises:

forming a hard mask carbon layer over the first hard mask layer;

forming a photoresist pattern over the hard mask carbon layer of the second region; and etching the hard mask carbon layer using the photoresist pattern as an etch barrier.

4. The method of claim 2, wherein the sacrificial pattern comprises amorphous carbon or spin-on carbon (SOC).

5. The method of claim 1, wherein the hard mask pattern comprises amorphous carbon or spin-on carbon (SOC).

6. The method of claim 1, wherein the removing of the hard mask pattern is performed by dry etching.

7. The method of claim 6, wherein the dry etching comprises an oxygen strip process.

8. The method of claim 1, wherein the first hard mask layer comprises nitride, and the second hard mask layer comprises polysilicon.

9. The method of claim 1, wherein the etch-target layer comprises a conductive layer.

10. The method of claim 1, wherein the etch-target layer comprises a stacked structure of a barrier metal layer and a metal layer.

11. A method for fabricating a semiconductor device, comprising:

forming an etch-target layer over a substrate having a first region and a second region;

forming a first hard mask pattern and a second hard mask pattern in the first region and the second region, respectively, wherein the first and second hard mask patterns have different heights; and performing an etching process using the first and second hard mask patterns as an etch barrier to form a first pattern and a second pattern in the first region and the second region, respectively, wherein the first region comprises a cell region, and the second region comprises a peripheral region.

12. The method of claim 11, wherein the forming of the first and second hard mask patterns comprises:

stacking a first hard mask layer and a second hard mask layer over the etch-target layer, the second hard mask layer having an etching selectivity with the first hard mask layer;

forming the second hard mask pattern of the first region by removing the second hard mask layer of the second region;

forming a hard mask carbon pattern;

forming the first hard mask pattern of the first and second regions using the second hard mask pattern and the hard mask carbon pattern as etch barriers; and removing the hard mask carbon pattern.

13. The method of claim 12, wherein the forming of the second hard mask pattern of the first region comprises:

forming spacer patterns over the second hard mask layer of the first region; and etching the second hard mask layer using the spacer patterns as an etch barrier to remove the second hard mask layer of the second region.

14. The method of claim 12, wherein the forming of the hard mask carbon pattern comprises:

forming a hard mask carbon layer to fill spaces between the second hard mask pattern over a structure including the first hard mask layer;

forming a photoresist pattern over the hard mask carbon layer of the second region; and etching the hard mask carbon layer using the photoresist pattern as an etch barrier to form the hard mask carbon pattern.

* * * * *